United States Patent [19]
Chen et al.

[11] Patent Number: 5,610,566
[45] Date of Patent: Mar. 11, 1997

[54] SAW FILTER WITH A COUPLED SAW IMPEDANCE ELEMENT

[75] Inventors: Dongpei Chen, Neuchatel, Switzerland; Clinton S. Hartmann, Dallas, Tex.; Serguei Kondratiev, Neuchatel, Switzerland; Victor Plessky, Les Geneveys-sur-Coffrane, Switzerland; Mohammed A. Sharif, Hauterive, Switzerland

[73] Assignee: Advanced SAW Products SA, Bevaix, Switzerland

[21] Appl. No.: 280,607

[22] Filed: Jul. 26, 1994

[30] Foreign Application Priority Data

Aug. 4, 1993 [GB] United Kingdom ............... 9316142

[51] Int. Cl.$^6$ ........................................ H03H 9/64
[52] U.S. Cl. ............ 333/194; 310/313 R; 310/313 D; 333/195
[58] Field of Search ................... 333/193, 194, 333/195, 196; 310/313 R, 313 B, 313 C, 313 D

[56] References Cited

U.S. PATENT DOCUMENTS

| | | | |
|---|---|---|---|
| 4,006,290 | 2/1977 | Momberger et al. | 333/193 X |
| 4,166,258 | 8/1979 | Tseng | 333/195 |
| 4,785,270 | 11/1988 | Kinsman | 333/193 |
| 5,093,638 | 3/1992 | Kinsman et al. | 333/195 |
| 5,254,962 | 10/1993 | Morris et al. | 333/202 X |

FOREIGN PATENT DOCUMENTS

| | | |
|---|---|---|
| 541284A1 | 5/1993 | European Pat. Off. . |
| 0600705 | 6/1994 | European Pat. Off. . |
| 0633659 | 1/1995 | European Pat. Off. . |
| 0633660 | 1/1995 | European Pat. Off. . |
| 52-19044 | 2/1977 | Japan . |
| 59-97216 | 1/1984 | Japan . |
| 3222511 | 10/1991 | Japan . |
| 454011 | 2/1992 | Japan . |

OTHER PUBLICATIONS

"Surface Acoustic Wave Resonators" by Haydl, Microwave Journal, vol. 19, No. 9, Sep. 1976, pp. 43–46.

Patent Abstracts of Japan, vol. 1, No. 47, Dec. 8, 1976, JP–A–51142943.

"Saw Integrated Modules for 800–MHz Cellular Radio Portable Telephones With New Frequency Allocations" by Hikita et al., IEEE Transactions on Ultrasonics, Ferroelectrics, and Frequency Control, vol. 36, No. 5, Sep. 1989, pp. 531–539.

"Design Methodology and Synthesis Techniques for Ladder–Type Saw Resonator Coupled Filters" by Hikita et al., 1993 IEEE Ultrasoni Symposium, pp. 15–24 no month.

"Development of Low–Loss Band–Pass Filters Using Saw Resonators for Portable Telephones" by Ikata et al., IEEE 1992 Ultrasonics Symposium, pp. 111–115 no month.

"SAW Devices for Consumer Communication Applications" by Ruppel et al., IEEE Transactions on Ultrasonics, Ferroelectrics, and Frequency Control, vol. 40, No. 9, Sep. 1993, pp. 438–452.

"Miniature SAW Antenna Duplexer for 800–MHz Portable Telephone Used in Cellular Radio Systems" by Hikita et al., *IEEE Transactions On Microwave Theory And Techniques*, vol. 36, No. 6, 1988, pp. 1048–1056 no month.

Primary Examiner—Benny T. Lee
Assistant Examiner—Justin P. Bettendorf
Attorney, Agent, or Firm—Perman & Green

[57] ABSTRACT

This invention relates to an electronic device having a frequency dependent signal transfer characteristic which is electrically coupled to at least one SAW transducer. The SAW transducer acts as a SAW impedance element since it exhibits frequency dependent electrical characteristics. Such characteristics are utilised so that the transmission loss of the SAW impedance element is high in a relatively low signal transfer region of the signal transfer characteristic of the electronic device, and low in a relatively high signal transfer region of the signal transfer characteristic of the electronic device. This has the advantage that signals outside of the passband of the electronic device can be attenuated without increasing the transmission loss of the electronic device in its passband.

20 Claims, 5 Drawing Sheets

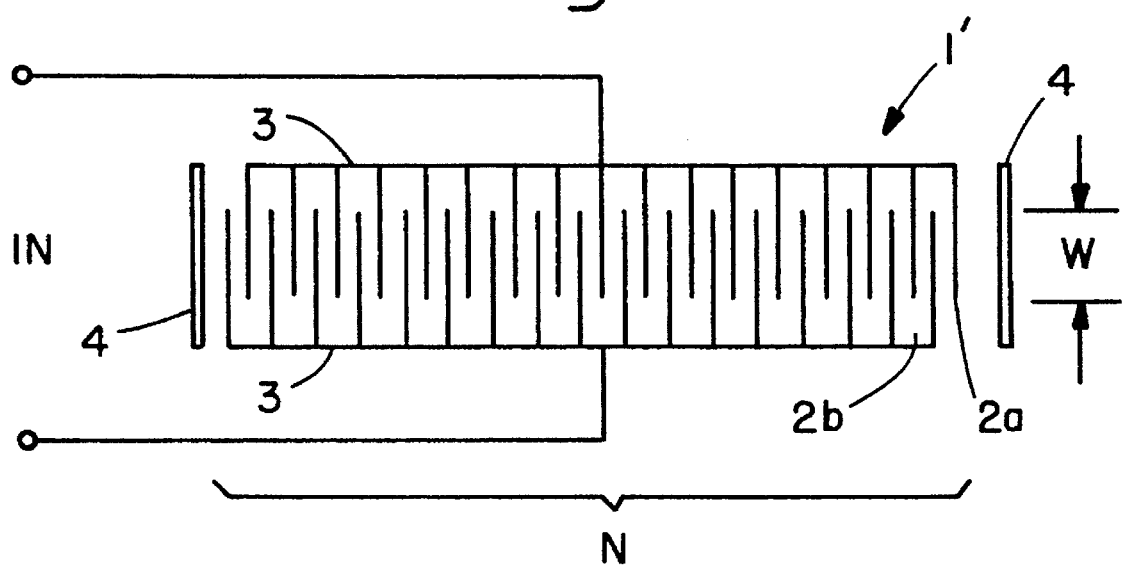

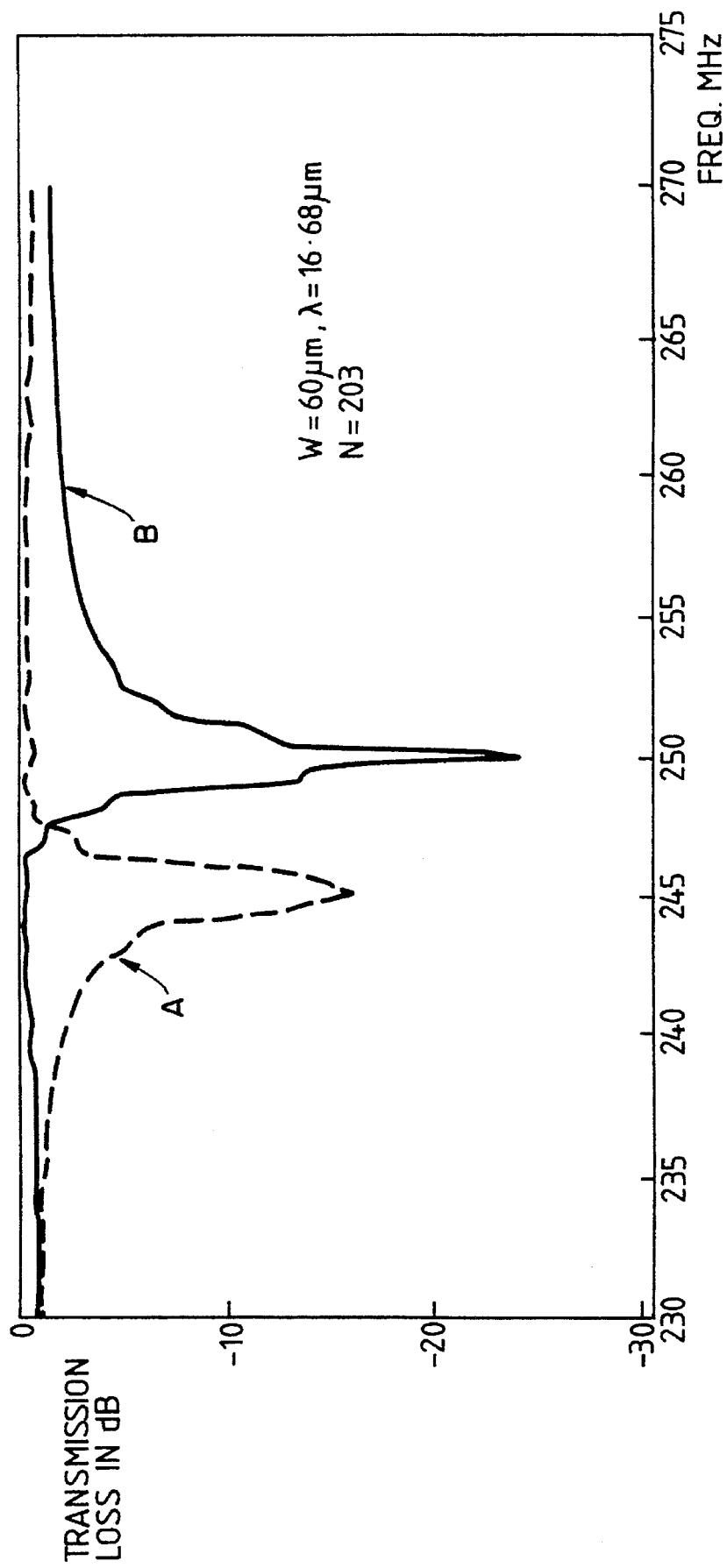

SAW FILTER WITH A COUPLED SAW IMPEDANCE ELEMENT

BACKGROUND OF THE INVENTION

This invention relates to an electronic device having a frequency dependent signal transfer characteristic. In particular, it relates to an electronic device which is electrically coupled to at least one SAW transducer.

SAW technology is increasingly finding more and more applications in the electronics and RF art. Due to the fact that SAW wavelengths are typically $10^5$ times shorter than those of electromagnetic waves, SAW technology is finding particular applications where miniaturization is important or desirable. One such application is the use of SAW filters in radio telephones, where the typically small size and weight of SAW filters is highly advantageous over conventional technologies, such as ceramic filters, lumped element filters or the like. It is a requirement of such filters that they have low-losses, typically insertion losses of 1~3dB.

A typical example of a conventional low-loss SAW filter is a transversal SAW filter in which SAW energy is transferred between two spaced apart interdigital transducers (IDTs). The IDTs each comprise two sets of electrode fingers which are formed on the surface of a piezoelectric substrate. The fingers in each set are typically all electrically connected together and are interleaved (interdigitated) with the electrode fingers of the other set. In a transversal SAW filter, electromagnetic energy is converted into SAW energy by coupling the electrostatic field pattern of an input IDT to a SAW by the piezoelectric effect.

A problem encountered with both low-loss SAW filters, and filters utilising conventional technology is that unacceptably high side lobes exist in the stopbands of the filters. Hitherto, this problem has been addressed by cascading identical filters or filters having identical or slightly different frequency transfer characteristics. However, such an approach typically results in complicated filter design, requires space to accommodate the extra components or extra tracks comprising the cascade of filters thereby mitigating against miniaturization, increases insertion loss and reduces the passband of the composite filter relative to the single filter whose characteristics it was desired to improve.

A further problem with SAW filters and transversal SAW filters in particular is that their maximum input power is limited due to the mechanical vibration caused by large amplitude SAWs degrading the IDT electrode fingers resulting in lower performance from the filter. Additionaly, conventional filters have relatively high losses, typically greater than 10 dB for transversal type SAW filters. Similar problems occur with SAW resonator-type filters.

It is known that SAW elements can be conceptually modelled and used as electrical impedance elements. Modelling and using a SAW resonator as an impedance element is possible because a SAW element such as a SAW resonator has an electrical impedance which is, in part, dependent on the electro-acoustic interaction of the electrode fingers of the SAW resonator with the mechanical vibration of the SAW. Near to the center frequency of the SAW element (i.e. the frequency at which the separation of adjacent fngers is $\lambda/2$) it has a maximum electrical admittance and a minimum electri.cal admittance. These are respectively the electrical resonant and anti-resonant frequencies of the SAW element. When large changes in electrical impedance are desired the electro-acoustic interaction must be high. Thus, SAW elements with a large number of electrode finger pairs are used. Reflectors can be placed at the ends of the SAW element to inhibit energy losses, thereby creating a resonator-type structure. Alternatively, SAW elements can be used which only have large numbers of electrode fingers since they exhibit electrical properties similar to SAW resonator-type structures. Since the SAW resonators in the known filter are utilized primarily as lumped impedances, it is convenient to term them SAW impedance elements. The term SAW impedance elements will hereinafter be used when referring to any SAW element (IDT SAW resonator or otherwise) which is being particularly used for its electrical impedance properties.

In the foregoing an individual SAW resonator can be modelled as a lumped impedance element connected in series, and a conventional capacitance (static capacitance $C_{ST}$) connected in parallel between two ports of the SAW resonator. The static capacitance is due, inter alia, to the capacitance between electrodes of the SAW resonator, between electrodes of the SAW resonator and a ground plane on the substrate, and the resonator to resonator coupling pattern and the ground plane if there are more than one resonator on the substrate.

SUMMARY OF THE INVENTION

According to a first aspect of the present invention there is provided an electronic device having a frequency dependent signal transfer characteristic and electrically coupled to at least one SAW impedance element, wherein the transmission loss of the SAW impedance element is high in a relatively low signal transfer region of the signal transfer characteristic and low in a relatively high signal transfer region of the signal transfer characterisic.

This has the advantage that in the relatively large signal transfer region (passband) of the device the insertion loss is substantially unaltered, yet at frequencies in the relatively low signal transfer region the insertion loss is greatly increased. Thus signals at frequencies outside the passband (i.e. in the stopband) of the device can be attenuated, without adversely affecting the passband characteristics. Furthermore, the SAW impedance element is small and lightweight and because the SAW impedance element can be arranged so that it is acoustically independent of the electronic device it can be made simple, as there is no need for precise positioning of the impedance element with respect to other elements, which reduces manufacturing costs. The design of the device can be simplified and its cost lowered if impedance elements are used instead of two or more electronic devices cascaded together.

In a preferred embodiment of the invention, the at least one SAW impedance element is coupled in series and/or in parallel with the electronic device.

Preferably, the electronic device is a SAW device. This has the advantage that the size and weight benefits afforded by the SAW impedance element are also obtained by the electronic device itself. Furthermore, the same fabrication process (i.e. lithography) can be used to manufacture both the SAW impedance element and SAW device, thereby simplifying the manufacturing process.

Suitably, the SAW impedance element is integral with the SAW device. Such an embodiment has the advantage that both the SAW transducer and SAW device can be fabricated on the same substrate. This greatly simplifies the fabrication process since the SAW impedance element and SAW device could be formed using a single lithographic process. Furthermore, the SAW impedance element could be disposed in unused parts of the SAW device substrate, such as between the input or output buses or instead of one of series connected tracks. Evidently, by fabricating the SAW impedance element integrally with the SAW device the composite circuit is less complex than separate SAW impedance element and SAW device circuits since the interconnections can be formed on the same substrate, and the size and weight of the composite circuit can be reduced. A SAW impedance element does not interact acoustically with the SAW device. Thus, the impedance element can be placed independently of other acoustically active circuitry of the SAW device. For example, it can be placed in a neighbouring acoustic channel, or in a perpendicular acoustic channel. The fact that the SAW impedance elements do not need to be fabricated to take account of acoustic interactions means that they can be made simple which results in more reliable and simple fabrication techniques, particularly at high frequencies.

Typically, the series coupled SAW impedance elements having a high impedance are located at the centre frequencies of the side-lobes, which reduces the high frequency side-lobe level and parallel coupled impedance elements have a low impedance located at the centre frequencies of low frequency side lobes which reduces the low frequency side lobe level, thereby improving the filter characteristics. Alternatively, respective series and a parallel coupled impedance elements could be located in the cut-off region of the filter, thereby sharpening the roll-off and improving the shape factor of the filter. Such arrangements have the advantage that the respectively oppositely biased asymmetric frequency transfer characteristics of series and parallel coupled SAW impedance elements can be utilised to attenuate particular frequencies on either or both sides of the passband of the electronic device without adversely affecting the passband characteristics.

In order to inhibit insertion losses due to the SAW impedance elements, series coupled SAW impedance elements should substantially satisfy the following relationship $$r_{(in/out)} \geq \frac{1}{\omega_o} \sum_{i=1}^{I} (N_i W_i C)^{-1},$$

where I is the number of connected elements, and parallel coupled SAW impedance elements should suitably satisfy the relationship $$r_{(in/out)} \leq \frac{1}{\omega_o} \left( \sum_{k=1}^{K} N_k W_k C \right)^{-1}$$

where K is the number of connected elements and the number of finger pairs N should substantially satisfy $N \geq (\Delta V/V)^{-1}$, where the $$\frac{\Delta V}{V}$$

parameter is commonly used as a measure of the strength of piezoelectric coupling. $\Delta V$ is the difference between SAW velocity on the open (free) surface and on the metallized surface. Electro-mechanical coupling coefficient $$K^2 = 2 \frac{\Delta V}{V}$$

is also frequently used.

In the above formulas $r_{in}$, $r_{out}$ are respectively the input and output loads of the electronic device, W is the aperture of the transducers, C is the normalised (per pair and per unit lingth of aperture capacitance between adjacent finger electrodes and $\omega_o$ is the centre frequency of the electronic device. It should be noted that the above equations apply to the impedance element electrically coupled closest to the input or output loads.

SAW impedance elements can comprise interdigital transducers (IDTs), interdigital transducers and reflectors or SAW resonators. This has the advantage that such SAW elements are well known variants whose characteristics are also well known, and can be easily fabricated. Thus, it would be a simple matter for a person skilled in the art to incorporate such SAW elements in the present invention.

For the sake of clarity and completeness it should be noted that the term SAW includes other types of waves similar to conventional surface acoustic waves, such as surface skimming bulk-waves (SSBWs), leaky waves and surface transverse waves (STWs), and references to SAWs throughout the specification include references to such similar waves or the like.

BRIEF DESCRIPTION OF THE DRAWINGS

Embodiments of the invention will now be described by way of example only and with reference to the drawings in which:

FIG. 2, shows the signal transfer characteristic of a parallel coupled impedance element (dotted) and a series coupled impedance element (solid);

DETAILED DESCRIPTION OF THE PREFERRED EMBODIMENT

Figure 1A:
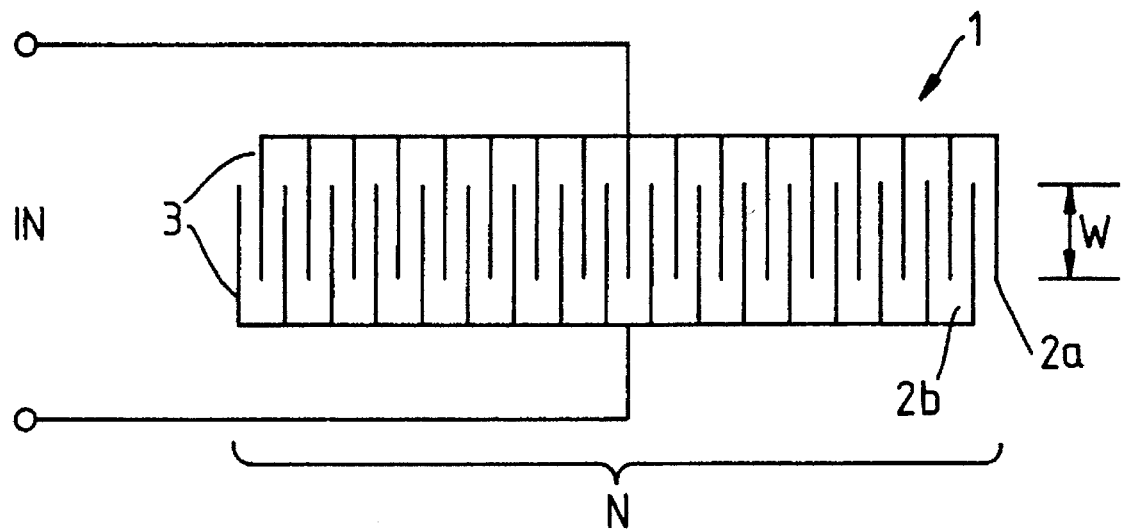
FIG. 1 shows (a) a single SAW interdigital transducer (IDT), and (b) an equivalent circuit of such a transducer.
FIG. 1C shows a single SAW interdigital transducer (IDT) similar to that shown in FIG. 1A, but with reflectors disposed at each end.
Figure 1B:
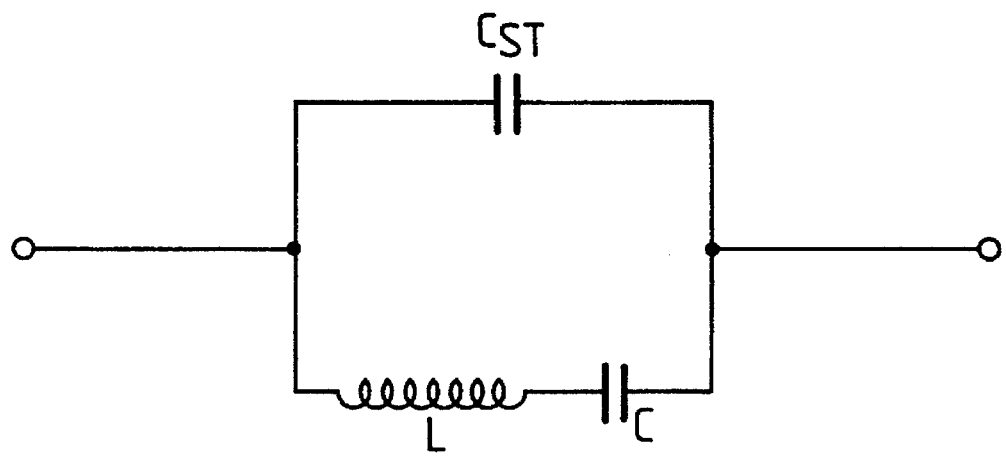

FIG. 1a shows a schematic layout diagram of a typical SAW transducer 1 known as an interdigital transducer (IDT) suitable for use as an impedance element. Adjacent fingers 2a and 2b comprise finger-pairs and are generally half of an acoustic wavelength ($\lambda_{ac}$) apart. The electrode fingers 2a, 2b are coupled to bus bars 3, which are connected to the input of the SAW transducer. The overlap (W) between the fingers defines the aperture of the transducer and N is the number of finger pairs. Such a SAW transducer has an equivalent circuit as shown in FIG. 1 (b). The static capacitance $C_{ST}$ is due to the capacitance between adjacent fingers 2a, 2b, and the series L-C circuit represent the electrical behaviour of the transducer 1 near to its resonant frequency $\omega_o$. The Applicant has found that the best results are achieved with SAW transducers having reflectors disposed at each end. FIG. 1C shows such a SAW transducer 1' with reflectors 4 disposed at each end.

It is a feature of SAW transducers with large numbers of electrodes N that at their resonant frequency they have a low impedance and at their anti-resonant frequency they have a high impedance. Thus, such SAW transducers can be thought of as resonant circuit or impedance elements and will be referred to as impedance elements. In this invention the number of electrodes N in each impedance element transducer is chosen such that $N \geq (\Delta V/V)^{-1}$ where $$\left( \frac{\Delta V}{V} \right)$$

is the realtive difference between the open surface SAW velocity and metallized surface SAW velocity, and is related to the electro-mechanical coupling parameter $$K^2 = 2 \frac{\Delta V}{V}$$

Such a value of N is chosen so that the impedance element has a low impedance at resonance and a high impedance at anti-resonance. The maximum value of N is limited by the size of the substrate upon which the SAW impedance element is to be supported and the desire to reduce so-called second order effects including: diffraction of acoustic beams in long structures; attenuation of the SAWs; and finite resistance of the electrodes. The same resonator type frequency characteristics of impedance elements can be achieved with a smaller number of electrodes, if one adds reflectors at the ends of the transducer. Reflectors can be made, for example, as shorted electrodes of the same width and periodicity as in the transducer, and symmetrically placed at both sides of the transducer.

The signal transfer characteristic of an impedance element varies depending upon whether it is coupled in series or in parallel into a circuit. The signal transfer characteristic of a test structure driven by a matched generator and load and comprising an impedance element on a 128-LiNbO$_3$ substrate having ~200 electrode finger pairs, an aperture of 60 μm and optimised for a SAW wavelength of 16.68 μm coupled in parallel, represented by dotted line A, and in series, represented by solid line B is shown in FIG. 2. FIG. 2 clearly shows that the signal transfer characteristic for respective series and parallel impedance elements is asymmetric and that the asymmetry is opposite for respective series and parallel coupled impedance elements. This asymmetry and the fact that it is respectively reversed for series and parallel coupled impedance elements is used to great effect in the present invention.

The resonant or centre frequency of an impedance element is determined by the periodicity (p) of the electrode fingers 2a, 2b. For a given resonance frequency the period of the electrode fingers is given by $P_k = V/f_k$, where V is the SAW velocity, and $f_k$ is the resonance frequency of the SAW impedance element. For a given anti-resonance frequency $f_i$ the periodicity of the electrode fingers 2a, 2b is given by $$p_i = \frac{V}{f_i * \left( 1 - C* \frac{\Delta V}{V} \right)},$$

where ($\Delta V/V$) parameter, as before, determines the electromechanical coupling. C is a constant (≈0.914 for single non split electrodes) and $f_i$ is the anti-resonance frequency. The factor ($1-C*\Delta V/V$) in the denominator adjusts the simple resonance frequency relationship to take into account the fact that anti-resonance is slightly shifted in frequency from the resonance frequency.

As described earlier, it is a common problem that the signal transfer characteristic of filters show a high side lobe level. However, utilising the asymmetry of appropriately designed series and parallel coupled impedance elements, side lobes can be suppressed. For a given passband filter having side lobes at $\pm \Delta f$ from its centre frequency $f_o$ series coupled impedance elements having periodicity $$P_i = \frac{V}{(f_o + \Delta f_i) \left( 1 - C* \frac{\Delta V}{V} \right)}$$

can be utilised to suppress side lobes at $+\Delta f$ without introducing any significant loss into the passband, and parallel coupled impedance elements having periodicity $$p_k = \frac{V}{f_o - \Delta f}$$

can be utilised to suppress side lobes at $-\Delta f$ without introducing losses into the passband where velocity V and the $\Delta V/V$ parameter have the same meaning as above.

Figure 3:
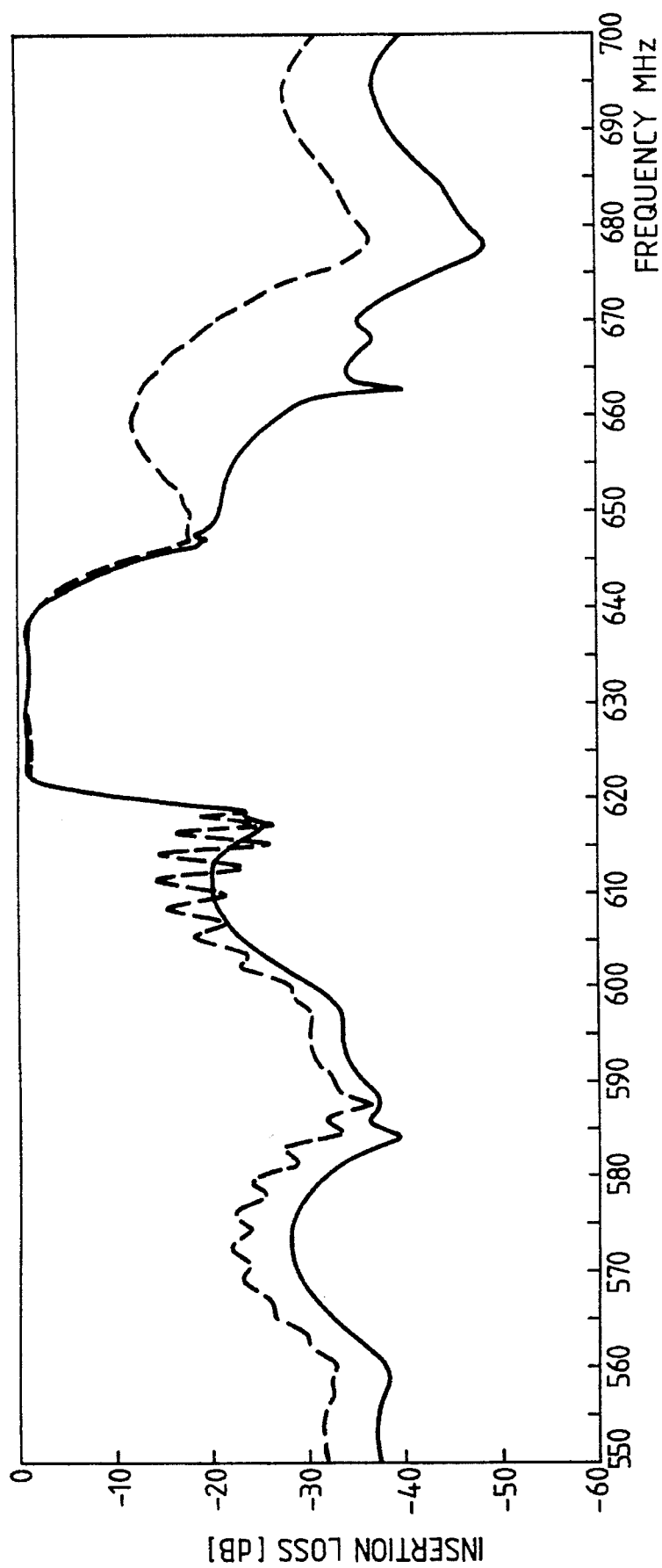
FIG. 3 shows the signal transfer characteristic of a passband filter with two series and parallel coupled impedance elements (solid) and without such impedance elements (dotted)

An example of how filter performance can be improved is shown in FIG. 3. The dotted curve in FIG. 3 is the insertion loss of a typical filter used in mobile telephone applications. The solid line shows the insertion loss with two impedance elements respectively coupled in series and in parallel with the mobile telephone filter. The impedance elements were respectively designed such that the series coupled impedance elements has 100 finger pairs and an aperture $W=15\lambda$ and the parallel coupled impedance element has 50 finger pairs and $W=3.5\lambda$, where $\lambda \approx 6.5$ μm. The centre frequency of the passband is ≈632 MHz, the frequency of series-connected impedance elements is ≈638 MHz with the anti-resonance frequency around 663 MHz; the centre frequency of parallel connected impedance elements is chosen at ≈592 MHz. FIG. 3 clearly shows that the side lobes have been suppressed without any substantial increase in the insertion loss of the passband filter.

Figure 4:
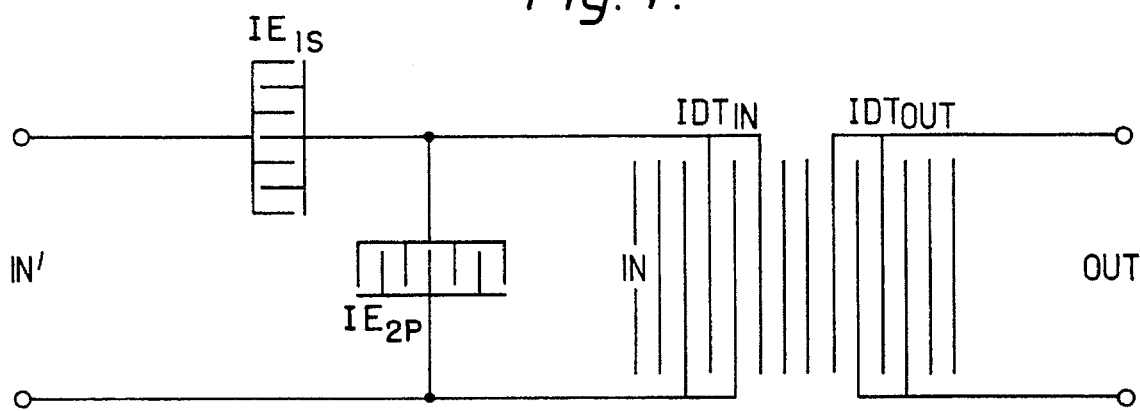
FIG. 4 shows two impedance elements respectively coupled in series and parallel to the input of a SAW transversal filter.

A typical layout for a SAW passband filter having series-parallel coupled impedance elements is shown in FIG. 4. $IDT_{in}$ and $IDT_{out}$ are the input and output transducers of a two-port SAW filter. The series-parallel coupled impedance elements $IE_{1S}$ and $IE_{2P}$ may be coupled to the output of the SAW fitter or one or other coupled to either the input or output of the SAW filter.

Figure 5A:
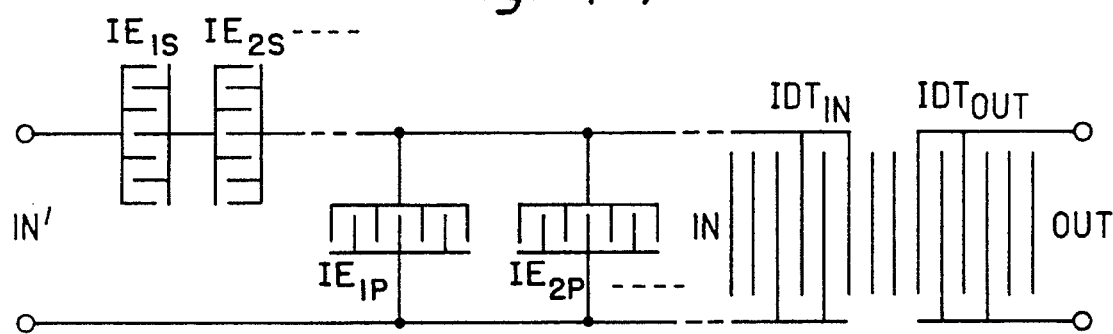
FIG. 5 shows various layouts configurations for cascaded series-parallel impedance elements.
Figure 5B:
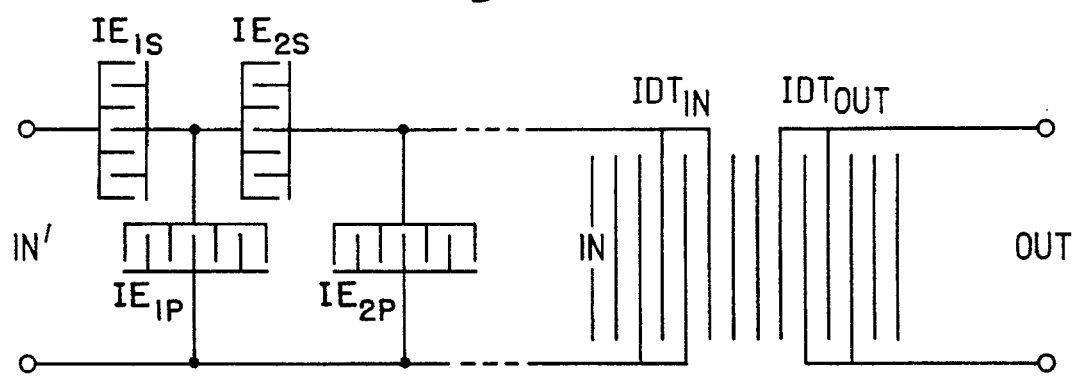

If it is desired to suppress more than one pair of side lobes then it is possible to cascade series-parallel coupled impedance elements to the input and/or output of the SAW filter. Two possible cascade arrangements are schematically shown in FIG. 5. The periodicity of the fingers in respective series coupled IDTs is given by $$p_i = \frac{V}{f_i * \left( 1 - C* \frac{\Delta V}{V} \right)},$$

where $f_i$ is the frequency in the higher side lobe it is desired to suppress, and the periodicity of the fingers in respective parallel coupled impedance elements is given by $$p_k = \frac{V}{f_k}$$

where $f_k$ is the frequency of the lower side lobes that it is desired to suppress. In these formulas, as before, V is the SAW velocity, $$\frac{\Delta V}{V} = \frac{1}{2} K^2$$

is a parameter which determines the strength of piezoelectric coupling, and C is a constant=0.914 for single electrodes.

In order to keep an increase in insertion loss due to series parallel coupled impedance elements to a minimum, the following relationships should be satisfied. For series coupled impedance elements electrically coupled to either the input or output loads $$r_{(in/out)} \geq \frac{1}{\omega_o} \sum_{i=1}^{I} (N_i W_i C)^{-1}$$

where $r_{in}$, $r_{out}$ are the input and output loads of the SAW device, $N_i$ and $W_i$ are the number of electrode finger pairs and the aperture respectively of the i-th series coupled transducer and C is the normalised static capacitance of one pair of electrodes.

For such a relationship the admittance due to the static capacitance of the electrode finger pairs is high relative to the input/output admittance of the electronic device at or near its centre frequency $\omega_o$, thereby ensuring that the series coupled impedance elements do not increase the insertion losses. For the parallel coupled impedance elements electrically coupled to either input or output loads, the following relationship should be satisfied in order to minimise insertion losses;

$$r_{(in/out)} \leq \frac{1}{\omega_o} \left( \sum_{k=1}^{K} N_k W_k C \right)^{-1}$$

In this and previous formula: N is the number of electrode pairs of "K-th" transducer, W is its aperture, C is the capacitance per one pair of electrodes per unit aperture, K is the number of connected transducers, thereby ensuring that there is low signal shunting at or near the centre frequency $\omega_o$ of the device, due to the parallel coupled impedance elements. In view of the foregoing description it will be evident to a person skilled in the art that various modifications may be made within the scope of the invention. In particular, the term SAW includes other types of waves similar to conventional surface acoustic waves, such as surface skimming bulk-waves (SSBWs), leaky waves and surface transverse waves (STWs). Furthermore, the invention may be used for generalised impedance matching in electronic circuits.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

We claim:

1. A low loss filter comprising:
   a filter means having a passband;
   a piezoelectric substrate; and
   a SAW impedance element supported by said piezoelectric substrate and electrically coupled in series to said filter means, wherein said SAW impedance element has an anti-resonance frequency in a frequency region higher than the passband for the filter means, wherein the low loss filter is a SAW filter.

2. A low loss filter according to claim 1 further comprising a SAW impedance element supported by said piezoelectric substrate and electrically coupled in parallel to said filter means, wherein said parallel coupled SAW impedance element has a resonance frequency in a frequency region lower than the passband for the filter means.

3. A low loss filter according to claim 1 wherein the series coupled SAW impedance element has an anti-resonance frequency corresponding to a high frequency side lobe in the frequency region higher than the passband for the filter means.

4. A low loss filter according to claim 1 wherein the series coupled SAW impedance element has an anti-resonance at a high cut-off frequency of the passband for the filter means.

5. A low loss filter according to claim 1 wherein the number of pairs of electrode fingers N comprising the SAW impedance element substantially satisfies the condition $$N \geq \left( \frac{\Delta V}{V} \right)^{-1}.$$

6. A low loss filter as in claim 1 wherein the filter means has an input and an output, and the SAW inpedance element is connected to the filter means at one of the input and output.

7. A low loss filter according to claim 1 wherein the series coupled SAW impedance element substantially satisfies the following condition:

$$r_{(in/out)} \geq \frac{1}{\omega_o} \left( \sum_{i=1}^{I} N_i W_i C \right)^{-1}.$$

8. A low filter according to claim 1 wherein said SAW impedance element is integral with the low loss filter.

9. A low loss filter according to claim 8 wherein said low loss filter is supported by the same piezoelectric substrate supporting the SAW impedance element.

10. A low loss filter comprising:
    a filter means having a passband;
    a piezoelectric substrate; and
    a SAW impedance element supported by said piezoelectric substrate and electrically coupled in parallel to said filter means, wherein said SAW impedance element has a resonance frequency in a frequency region lower than the passband for the filter means, wherein the low loss filter is a SAW filter.

11. A low loss filter according to claim 10 wherein the parallel coupled SAW impedance element has a resonance at a frequency corresponding to a low frequency side lobe in the frequency region lower than the passband for the filter means.

12. A low loss filter according to claim 10 wherein the parallel coupled SAW impedance element has a resonance at a frequency corresponding to a low cut-off frequency of the signal transfer characteristic.

13. A low loss filter according to claim 10 wherein the parallel coupled SAW impedance element substantially satisfies the following conidition:

$$r_{(in/out)} \leq \frac{1}{\omega_o} \left( \sum_{k=1}^{K} N_k W_k C \right)^{-1}.$$

14. A low loss filter according to claim 10 wherein said SAW impedance element is integral with the low loss filter.

15. A low loss filter according to claim 10 wherein the number of pairs of electrode fingers N comprising the SAW impedance element substantially satisfies the condition $$N \geq \left( \frac{\Delta V}{V} \right)^{-1}$$

16. A low loss filter as in claim 10 wherein the filter means has an input and an output, and the SAW impedance element is connected to the filter means at one of the input and output.

17. A radio telephone low loss filter comprising:

a filter means having a passband;

a piezoelectric substrate; and a SAW impedance element supported by said piezoelectric substrate and electrically coupled in series to said filter means, wherein said SAW impedance element has an anti-resonance frequency in a frequency region higher than the passband for the filter means, wherein the low loss filter is a SAW filter.

18. A radio telephone low loss filter comprising:

a filter means having a passband;

a piezoelectric substrate; and a SAW impedance element supported by said piezoelectric substrate and electrically coupled in parallel to said filter means, wherein said SAW impedance element has a resonance frequency in a frequency region lower than the passband for the filter means, wherein the low loss filter is a SAW filter.

19. A low loss filter comprising:

a filter means having a passband;

a piezoelectric substrate; and a SAW impedance element supported by said piezoelectric substrate and electrically coupled in series to said filter means, wherein said SAW impedance element has an anti-resonance frequency in a frequency region higher than the passband for the filter means, wherein the series coupled SAW impedance element substantially satisfies the following condition:

$$r_{(in/out)} \geq \frac{1}{\omega_o} \left( \sum_{i=1}^{I} N_i W_i C \right)^{-1}.$$

20. A low loss filter comprising:

a filter means having a passband;

a piezoelectric substrate; and a SAW impedance element supported by said piezoelectric substrate and electrically coupled in parallel to said filter means, wherein said SAW impedance element has a resonance frequency in a frequency region lower than the passband for the filter means, wherein the parallel coupled SAW impedance element substantially satisfies the following condition:

$$r_{(in/out)} \leq \frac{1}{\omega_o} \left( \sum_{k=1}^{k} N_k W_k C \right)^{-1}.$$

* * * * *